| (12) | United States Patent | (10) Patent No.: | US 9,293,211 B2 |
|---|---|---|---|
| | Park | (45) Date of Patent: | Mar. 22, 2016 |

(54) SEMICONDUCTOR DEVICE AND METHOD OF OPERATING THE SAME

(71) Applicant: SK hynix Inc., Gyeonggi-do (KR)

(72) Inventor: Seong Je Park, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 113 days.

(21) Appl. No.: 14/106,559

(22) Filed: Dec. 13, 2013

(65) Prior Publication Data

US 2014/0376315 A1    Dec. 25, 2014

(30) Foreign Application Priority Data

Jun. 21, 2013   (KR) .................. 10-2013-0071660

(51) Int. Cl.
G11C 11/34 (2006.01)
G11C 16/26 (2006.01)
G11C 16/34 (2006.01)
G11C 11/56 (2006.01)
G11C 16/04 (2006.01)

(52) U.S. Cl.
CPC ............ *G11C 16/26* (2013.01); *G11C 11/5642* (2013.01); *G11C 16/3459* (2013.01); *G11C 16/0483* (2013.01)

(58) Field of Classification Search
CPC .............. G11C 16/0483; G11C 16/26; G11C 16/3459; G11C 11/5642; G11C 2211/5621; G11C 2211/5642; G11C 7/106; G11C 7/1087
USPC ............. 365/185.03, 185.11, 185.17, 185.21, 365/185.22, 185.25, 189.011, 189.15, 365/189.17, 189.05, 196
See application file for complete search history.

(56) References Cited

U.S. PATENT DOCUMENTS

| 9,042,175 B2 * | 5/2015 | Sim et al. ................. 365/185.17 |
| 2005/0135157 A1 * | 6/2005 | Shiga ....................... 365/185.29 |
| 2010/0172181 A1 * | 7/2010 | Murakami ............... 365/185.12 |
| 2012/0250413 A1 * | 10/2012 | Kim ......................... 365/185.12 |
| 2012/0269007 A1 * | 10/2012 | Yang et al. .............. 365/189.05 |
| 2014/0347928 A1 * | 11/2014 | Lee .......................... 365/185.11 |

FOREIGN PATENT DOCUMENTS

| KR | 1020090055806 | 6/2009 |
| KR | 1020120095051 | 8/2012 |

* cited by examiner

*Primary Examiner* — Fernando Hidalgo
(74) *Attorney, Agent, or Firm* — IP & T Group LLP

(57) ABSTRACT

A semiconductor memory device includes a memory cell, a page buffer including a first and a second switching devices coupled in common to a sensing node coupled to the memory cell through a bit line and a first and a second sensing latch units coupled to the sensing node, respectively, through the first and the second switching devices, and a control logic suitable for transferring a first and a second sensing signals, respectively, to the first and the second switching devices when a threshold voltage of the memory cell is reflected on the sensing node through the bit line during a verification operation. The first and the second switching devices are turned on or off, respectively, in response to the first and the second sensing signals, and data are sensed by the first and the second sensing latch units.

20 Claims, 11 Drawing Sheets

SEMICONDUCTOR DEVICE AND METHOD OF OPERATING THE SAME

CROSS-REFERENCE TO RELATED APPLICATION

The present application claims priority of Korean patent application number 10-2013-0071660, filed on Jun. 21, 2013, the entire disclosure of which is incorporated herein by reference in its entirety.

BACKGROUND

1. Field of Invention

Various embodiments of the present invention relate to an electronic device and, more particularly, to a semiconductor memory device.

2. Description of Related Art

A semiconductor memory device is a storage device that is realized using a semiconductor made from, for example, silicon (Si), germanium (Ge), gallium arsenide (GaAs) or indium phosphide (InP). Semiconductor memory devices can be classified into volatile memory devices and non-volatile memory devices.

Volatile memory devices are unable to retain the stored data when the power is off. Examples of the volatile memory devices may include Static RAM (SRAM), Dynamic RAM (DRAM) and Synchronous DRAM (SDRAM). Non-volatile memory devices can retain the stored data regardless of power on/off conditions. Examples of the non-volatile memory include Read Only Memory (ROM), Mask ROM (MROM), Programmable ROM (PROM), Erasable Programmable ROM (EPROM), Electrically Erasable and Programmable ROM (EEPROM), flash memory, Phase-change Random Access Memory (PRAM), Magnetic RAM (MRAM), Resistive RAM (RRAM) and Ferroelectric RAM (FRAM). Flash memories may be classified into NOR-type memories and NAND-type memories.

BRIEF SUMMARY

Exemplary embodiments of the present invention relate to a semiconductor memory device having improved speed, a method of operating the same, a memory system having the same and a computing system having the same.

A semiconductor memory device according to an exemplary embodiment of the present invention may include a memory cell, a page buffer including a first and a second switching devices coupled in common to a sensing node coupled to the memory cell through a bit line and a first and a second sensing latch units coupled to the sensing node, respectively, through the first and the second switching devices and a control logic suitable for transferring a first and a second sensing signals, respectively, to the first and the second switching devices when a threshold voltage of the memory cell is reflected on the sensing node through the bit line during a verification operation. The first and the second switching devices are turned on or off, respectively, in response to the first and the second sensing signals, and data are sensed by the first and the second sensing latch units.

A method of operating a semiconductor memory device according to an embodiment of the present invention may include precharging a bit line coupled to a memory cell, reflecting a threshold voltage of the memory cell on the bit line and transferring a plurality of sensing signals to a plurality of switching devices coupled between a sensing node and sensing latch units when a voltage of the bit line is transferred to the sensing node. The plurality of switching devices are turned on or off, respectively, in response to the plurality of sensing signals, and data are transferred to the sensing latch units.

A memory system according to an exemplary embodiment of the present invention may include a semiconductor memory device and a controller suitable for controlling the semiconductor memory device, wherein the semiconductor memory device may comprise a memory cell, a page buffer including a first and a second switching devices coupled in common to a sensing node coupled to the memory cell through a bit line and a first and a second sensing latch units coupled to the sensing node, respectively, through the first and the second switching devices and a control logic suitable for transferring a first and a second sensing signals, respectively, to the first and the second switching devices when a threshold voltage of the memory cell is reflected on the sensing node through the bit line during a verification operation. The first and the second switching devices are turned on or off, respectively, in response to the first and the second sensing signals, and data are latched by the first and the second sensing latch units.

A computing system according to an exemplary embodiment of the present invention may include a semiconductor memory device, wherein the semiconductor memory device includes a memory cell, a page buffer including a first and a second switching devices coupled in common to a sensing node coupled to the memory cell through a bit line and a first and a second sensing latch units coupled to the sensing node, respectively, through the first and the second switching devices and a control logic suitable for transferring a first and a second sensing signals respectively to the first and the second switching devices when a threshold voltage of the memory cell is reflected on the sensing node through the bit line during a verification operation, wherein the first and the second switching devices are turned on or off, respectively, in response to the first and the second sensing signals, and data are latched by the first and the second sensing latch units.

DESCRIPTION OF EMBODIMENTS

Figure 1:
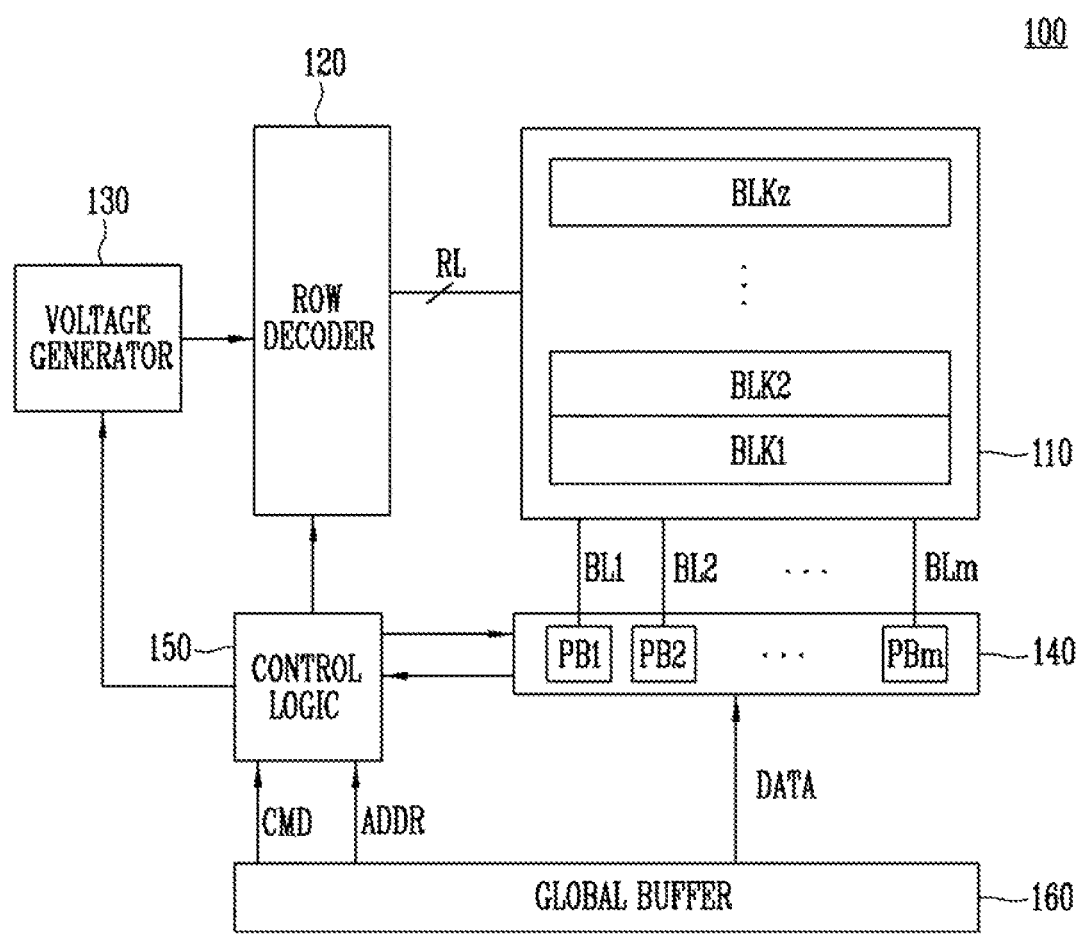
FIG. 1 is a block diagram illustrating a semiconductor memory device.

Hereinafter, various embodiments of the present invention will be described in detail with reference to the accompanying drawings. The figures are provided to enable those of ordinary skill in the art to make and use the present invention according to the exemplary embodiments of the present invention. Throughout the disclosure, reference numerals correspond directly to the like numbered parts in the various figures and embodiments of the present invention.

The drawings are not necessarily to scale and in some instances, proportions may have been exaggerated in order to clearly illustrate features of the embodiments.

Furthermore, 'connected/coupled' represents that one component is directly coupled to another component or indirectly coupled through another component. In this specification, a singular form may include a plural form as long as it is not specifically mentioned in a sentence. Furthermore, 'include/comprise' or 'including/comprising' used in the specification represents that one or more components, steps, operations and elements exists or are added.

FIG. 1 is a block diagram illustrating a semiconductor memory device.

Referring to FIG. 1, the semiconductor memory device 100 may include a memory cell array 110, a row decoder 120, a voltage generator 130, a read and write circuit 140, a control logic 150, and a global buffer 160.

The memory cell array 110 may include a plurality of memory blocks BLK1 to BLKz. The memory blocks BLK1 to BLKz may be coupled to the row decoder 120 through row lines RL and to the read and write circuit 140 through bit lines BL1 to BLm. Each of the memory blocks BLK1 to BLKz may include a plurality of memory cells. According to an embodiment, the memory cells of the memory block BLK1 may be non-volatile memory cells.

The row decoder 120, the voltage generator 130, the read and write circuit 140, the control logic 150 and the global buffer 160 may operate as a peripheral circuit to drive the memory cell array 110.

The row decoder 120 may be coupled to the memory cell array 110 through the row lines RL. The row decoder 120 may be controlled by the control logic 150. The row decoder 120 may receive addresses ADDR through the control logic 150.

Programming of the semiconductor memory device 100 may be performed with a page as a unit. The addresses ADDR input to the memory device 100 during program may include a block address and a row address.

The row decoder 120 may decode the block address in the input addresses ADDR. The row decoder 120 may select one from the memory blocks BLK1 to BLKz in response to the decoded block address.

The row decoder 120 may decode the row address in the input addresses ADDR to select one word line in a selected memory block. The row decoder 120 may apply a program voltage from the voltage generator 130 to a selected word line and apply a program pass voltage from the voltage generator 130 to unselected word lines.

The row decoder 120 may include an address buffer, a block decoder, and a row decoder.

The voltage generator 130 may be controlled by the control logic 150. The voltage generator 130 may generate an internal power voltage by using an external power voltage supplied to the semiconductor memory device 100. For example, the voltage generator 130 may generate the internal power voltage by regulating the external power voltage. The internal power voltage may be applied to the row decoder 120, the read and write circuit 140, the control logic 150, and the global buffer 160 as an operating voltage of the semiconductor memory device 100.

In addition, the voltage generator 130 may generate a plurality of voltages by using the external power voltage or the internal power voltage. According to an embodiment, the voltage generator 130 may include a plurality of pumping capacitors receiving the internal power voltage and generate a plurality of voltages by selectively activating the plurality of pumping capacitors through control of the control logic 150. For example, the voltage generator 130 may generate the program voltage and the program pass voltage having a lower voltage level than the program voltage during a program operation. The generated voltages may be applied to the row decoder 120.

The read and write circuit 140 may be coupled to the memory cell array 110 through the bit lines BL1 to BLm. The read and write circuit 140 may include a plurality of page buffers PB1 to PBm. The page buffers PB1 to PBm may be controlled by the control logic 150.

The page buffers PB1 to PBm may receive the data DATA from the global buffer 160, store the data DATA and program memory cells coupled to the selected word line in response to the data DATA during the program operation.

The control logic 150 may receive a command CMD and the addresses ADDR from the global buffer 160. The control logic 150 may transfer the received addresses ADDR to the row decoder 120. In addition, the control logic 150 may control the row decoder 120, the voltage generator 130, the read and write circuit 140, and the global buffer 160 in response to the received command CMD.

The global buffer 160 may be coupled to the read and write circuit 140 and the control logic 150. The global buffer 160 may be controlled by the control logic 150. The global buffer 160 may receive the command CMD, the addresses ADDR and the data DATA from exterior. The global buffer 160 may transfer the command CMD to the control logic 150 and transfer the data DATA to the read and write circuit 140. The global buffer 160 may transfer the addresses ADDR to the row decoder 120 through the control logic 150 or may directly transfer the addresses ADDR to the row decoder 120.

Figure 2:
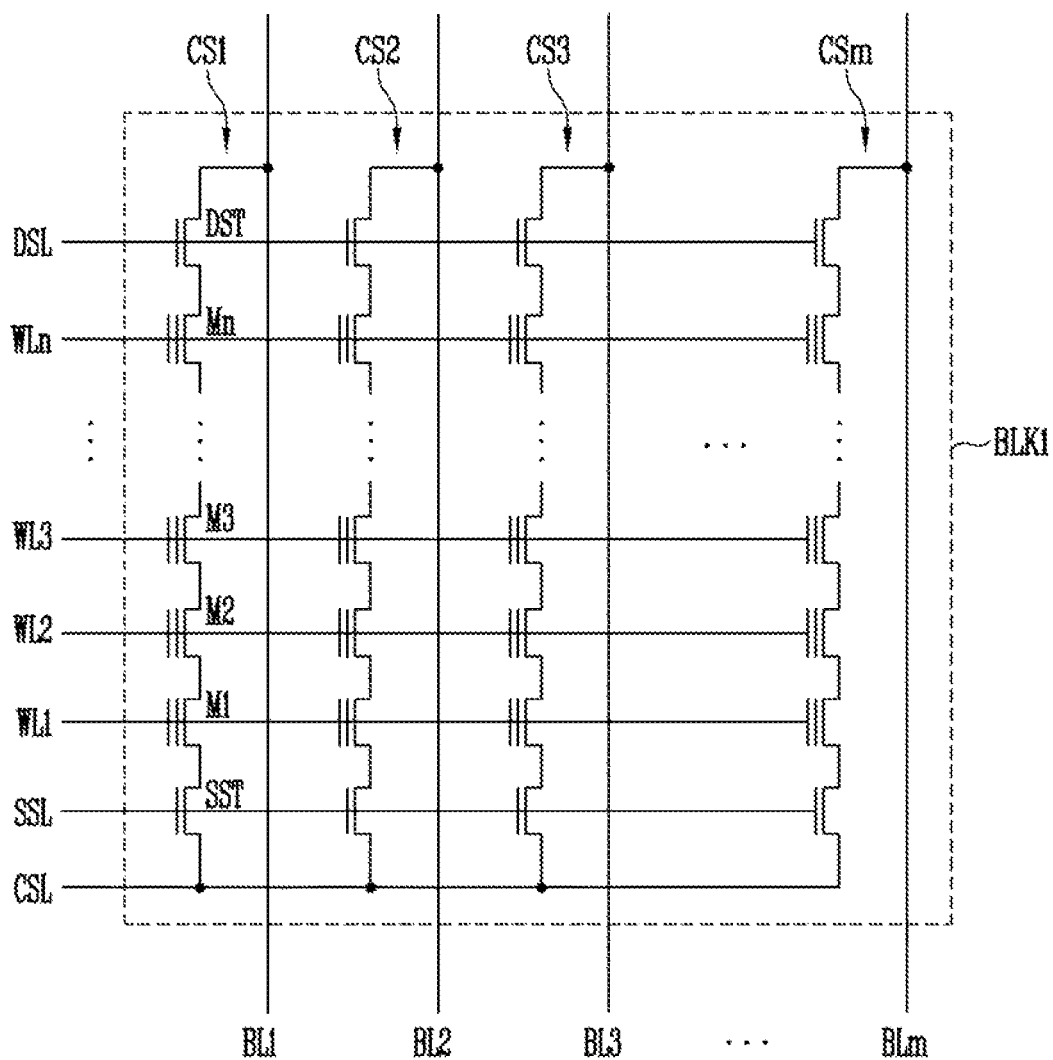
FIG. 2 is a circuit diagram illustrating a memory block shown in FIG. 1.

FIG. 2 is a circuit diagram illustrating a memory block shown in FIG. 1. FIG. 2 illustrates the memory block BLK1 as an example.

Referring to FIG. 2, the memory block BLK1 may include first to m-th cell strings CS1 to CSm. The first to m-th cell strings CS1 to CSm may be coupled to first to m-th bit lines BL1 to BLm, respectively. The first to m-th cell strings CS1 to CSm may be coupled to a common source line CSL, a source selection line SSL, first to n-th word lines WL1 to WLn, and a drain selection line DSL.

Each of the cell strings CS1 to CSm may include a source selection transistor SST, memory cells M1 to Mn coupled in series with each other and a drain selection transistor DST. The source selection transistor SST may be coupled to the source selection line SSL. The first to n-th memory cells M1 to Mn may be coupled to the first to n-th word lines WL1 to WLn, respectively. The drain selection transistor DST may be coupled to the drain selection line DSL. A source of the source selection transistor SST may be coupled to the common source line CSL. A drain of the drain selection transistor DST may be coupled to a corresponding bit line.

The source selection line SSL, the first to n-th word lines WL1 to WLn and the drain selection line DSL may be included in the row lines RL shown in FIG. 1. The source selection line SSL, the first to n-th word lines WL1 to WLn and the drain selection line DSL may be controlled by the row decoder 120. The common source line CSL may be controlled by, for example, the control logic 150.

Figure 3:
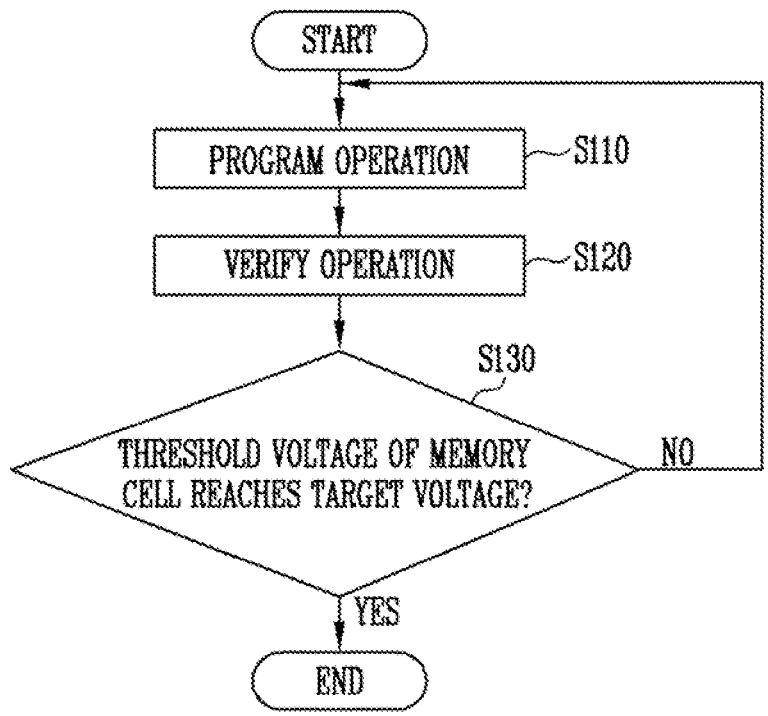
FIG. 3 is a flowchart illustrating a program operation of a semiconductor memory device.

FIG. 3 is a flowchart illustrating a program operation of a semiconductor memory device.

Referring to FIGS. 2 and 3, a program operation may be performed at step S110. For example, a program voltage having a high voltage level may be applied to a selected word line, for example, WL2, a program pass voltage may be applied to unselected word lines, for example, WL1, WL3 to WLn, a power voltage may be applied to the source selection line SSL and a ground voltage may be applied to the drain selection line DSL.

The page buffers PB1 to PBm may control the first to m-th bit lines BL1 to Blm, respectively, in response to the data DATA shown in FIG. 1 to be programmed. A program inhibition voltage, for example, power voltage may be applied to a bit line coupled to a memory cell whose threshold voltage is maintained or a program-inhibited cell. A specific voltage less than the program inhibition voltage may be applied to a bit line coupled to a memory cell whose threshold voltage is increased (hereinafter, referred to as a program-enabled cell).

A verification operation may be performed at step S120. First, the bit lines BL1 to BLm may be precharged. The power voltage may be applied to the source selection line SSL and the drain selection line DSL so that the source selection transistor SST and the drain selection transistor DST may be turned on. A target voltage may be applied to the selected word line and a verification pass voltage may be applied to the unselected word lines. Memory cells or selected memory cells coupled to the selected word line may be turned on or off by threshold voltages thereof. Memory cells or unselected memory cells coupled to the unselected word lines may be turned on by the verification pass voltage. Voltages of the bit lines BL1 to BLm may change depending on whether the selected memory cells are turned on or off. The page buffers PB1 to PBm may sense voltage changes of the bit lines BL1 to BLm and transfer a sensing result to the control logic 150.

Referring to step S130, the control logic 150 may repeat steps S110 and S120 until the threshold voltage of the memory cell has reached the target voltage.

Figure 4:
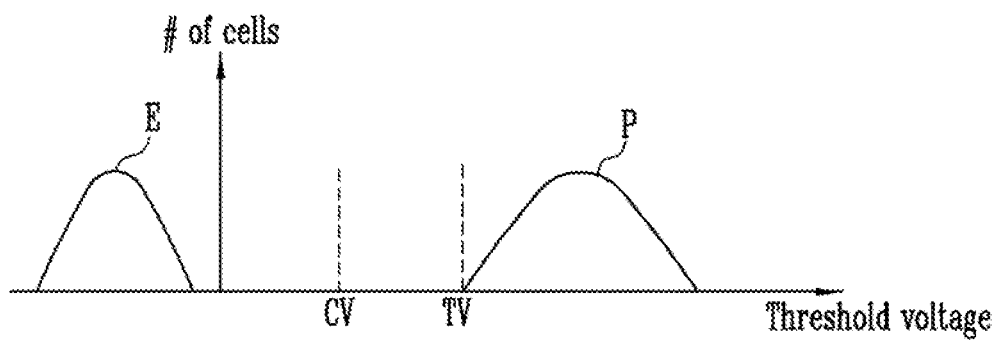
FIG. 4 is a diagram illustrating threshold voltage distribution when one bit is stored per memory cell.

FIG. 4 is a diagram illustrating threshold voltage distribution when one bit is stored per memory cell.

The horizontal axis represents a threshold voltage of a memory cell and the vertical axis represents the number of memory cells.

Referring to FIG. 4, when program is completed, the memory cells may have an erase state E or a program state P, which has higher voltage than a target voltage TV. The memory cells may have the erase state E before program is performed. As the program operation (S110 shown in FIG. 3) is repeated, program-inhibited cells may have the erase state E and the program-enabled cells may have the program state P.

Two verification operations may be performed per program operation. In other words, a first verification operation may be performed by applying a critical voltage CV to the selected word line, and a second verification operation may be performed by applying the target voltage TV to the selected word line. Therefore, program-enabled cells having threshold voltages less than the critical voltage CV, program-enabled cells having threshold voltages between the critical voltage CV and the target voltage TV and program-enabled cells having threshold voltages greater than the target voltage TV may be detected.

In a subsequent program operation, a program enablement voltage may be applied to bit lines of the program-enabled cells having the threshold voltages less than the critical voltage CV. In addition, a voltage between the program enablement voltage and the program inhibition voltage may be applied to bit lines of the program-enabled cells having the threshold voltages between the critical voltage CV and the target voltage TV. Further, a program inhibition voltage may be applied to bit lines of the program-enabled cells having the threshold voltages greater than the target voltage TV.

When program is performed as described above, the threshold voltages of the program-enabled cells may not excessively increase so that distribution width of the program state P may become narrower after the program is completed, and thus read margin may be increased.

The program operation described above with reference to FIG. 4 may be applied to program operation in order to store two bits per memory cell.

Figure 5:
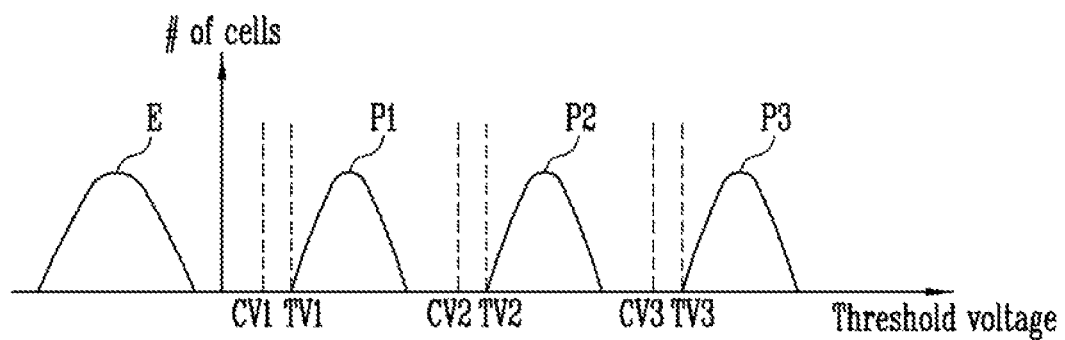
FIG. 5 is a diagram illustrating threshold voltage distribution when two bits are stored per memory cell.

FIG. 5 is a diagram illustrating threshold voltage distribution when two bits are stored per memory cell.

Referring to FIG. 5, verification operations may be performed on program-enabled cells to be programmed to a first program state P1 by using a first critical voltage CV1 and a first target voltage TV1, verification operations may be performed on program-enabled cells to be programmed to a second program state P2 by using a second critical voltage CV2 and a second target voltage TV2, and verification operations may be performed on program-enabled cells to be programmed to a third program state P3 by using a third critical voltage CV3 and a third target voltage TV3. Since there is no program state higher than the third program state P3, a single verification operation may be performed on the program-enabled cells to be programmed to the third program state P3 by using the third target voltage TV3.

In a subsequent program operation, the program enablement voltage, the voltage between the program enablement voltage and the program inhibition voltage or the program inhibition voltage may be applied to the bit lines BL1 to BLm based on a sensing result.

According to the program operation as described above, distribution width of each state may become narrower, while the time for program may be increased due to an excessive number of verification operations being performed. For example, two verification operations may be required for a single program operation in a program operation for storing one bit per memory cell, and five or more verification operations may be required for a single program operation in a program operation for storing two bits per memory cell. More verification operations will be required for a single program operation in a program operation for storing more bits per memory cell. Therefore, a need arises for a reduction in the number of verification operations being performed.

Figure 6:
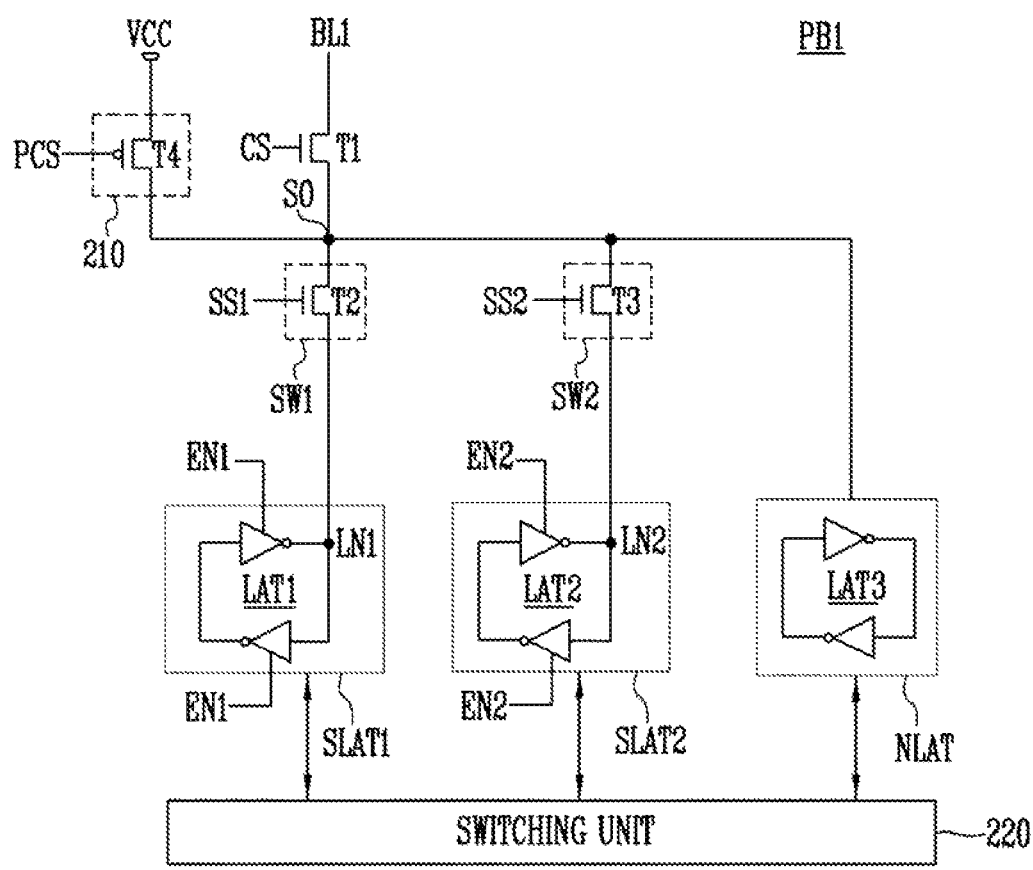
FIG. 6 is a block diagram illustrating a page buffer according to an embodiment of the present invention.

FIG. 6 is a block diagram illustrating a page buffer according to an embodiment of the present invention. FIG. 6 shows the page buffer PB1 as an example.

Referring to FIG. 6, the page buffer PB1 may include a transistor T1, a first and a second switching devices SW1 and SW2, a first and a second sensing latch units SLAT1 and SLAT2, a normal latch unit NLAT, a precharge unit 210, and a switching unit 220. The page buffer PB1 may include more than one normal latch units.

The first transistor T1 may be a NMOS transistor and may be coupled between a bit line BL1 and a sensing node SO. The first transistor T1 may be turned on in response to a connection signal CS. The connection signal CS may be received from the control logic 150 shown in FIG. 1.

According to an embodiment of the present invention, the first and the second switching devices SW1 and SW2 may be arranged between the sensing node SO and the first and the second sensing latch units SLAT1 and SLAT2, respectively. The first and the second switching devices SW1 and SW2 may be coupled to a first and a second latch nodes LN1 and LN2 of the first and the second sensing latch units SLAT1 and SLAT2, respectively.

The first and the second switching devices SW1 and SW2 may include second and third transistors T2 and T3, respectively. The second and third transistors T2 and T3 may operate in response to a first and a second sensing signals SS1 and SS2 of different voltages, respectively. The first and the second sensing signals SS1 and SS2 may be received from the control logic 150.

During a verification operation, the first and the second sensing signals SS1 and SS2 may be enabled when threshold voltages of corresponding memory cells are reflected on the sensing node SO through the bit line BL1, respectively, and thus may have different voltage levels.

The first and the second sensing latch units SLAT1 and SLAT2 may be coupled to the first and the second switching devices SW1 and SW2, respectively. The first and the second sensing latch units SLAT1 and SLAT2 may include a first and a second latches LAT1 and LAT2, respectively. The first and the second latches LAT1 and LAT2 may be activated or deactivated in response to a first and a second enable signals EN1 and EN2, respectively. The first and the second enable signals EN1 and EN2 may be received from the control logic 150.

When each of the enable signals EN1 and EN2 is enabled, the corresponding sensing latch unit may maintain internally stored data regardless of electrical connection of the corresponding sensing latch unit to the sensing node SO. On the other hand, when each of the enable signals EN1 and EN2 is disabled, the corresponding sensing latch unit may store changed data depending on electrical connection of the corresponding sensing latch unit to the sensing node SO.

During a verification operation, initial data having a logic value "high" may be stored in the first and the second latch nodes LN1 and LN2. It is assumed that the sensing node SO is node of sources of the second and third transistors T2 and T3.

The second transistor T2 may be turned on by a voltage of the sensing node SO that is less than a voltage obtained by subtracting a threshold voltage of the second transistor T2 from a voltage of the first sensing signal SS1. When the first enable signal EN1 is disabled, charges of the first latch node NL1 may be discharged to the sensing node SO and a logic value of the first latch node NL1 may be changed to "low." The second transistor T2 may be turned off by the voltage of the sensing node SO that is higher than the voltage obtained by subtracting the threshold voltage of the second transistor T2 from the voltage of the first sensing signal SS1.

The third transistor T3 may be turned on by the voltage of the sensing node SO that is less than a voltage obtained by subtracting a threshold voltage of the third transistor T3 from a voltage of the second sensing signal SS2. When the second enable signal EN2 is disabled, a logic value of the second latch node LN2 may be changed to "low" in response to the voltage of the sensing node SO. The third transistor T3 may be turned off by the voltage of the sensing node SO that is higher than the voltage obtained by subtracting the threshold voltage of the third transistor T3 from the voltage of the second sensing signal SS2.

In response to control of the control logic 150, data sensed by the first and the second sensing latch units SLAT1 and SLAT2 may be transferred to the control logic 150 through the switching unit 220.

The normal latch unit NLAT may be coupled between the sensing node SO and the switching unit 220. During program operation of the semiconductor memory device 100, the normal latch unit NLAT may receive data from the global buffer 160 shown in FIG. 1 through the switching unit 220. The normal latch unit NLAT may receive data to be programmed into the memory cell coupled to the bit line BL1, among the data shown in FIG. 1 to be programmed into the selected memory cells.

The precharge unit 210 may include a PMOS type fourth transistor T4. The fourth transistor T4 may be coupled between a power node VCC and the sensing node SO. The fourth transistor T4 may be turned on in response to a precharge signal PCS. The precharge signal PCS may be received from the control logic 150.

The switching unit 220 may be coupled to the first and the second sensing latch units SLAT1 and SLAT2 and the normal latch unit NLAT. The switching unit 220 may transfer the data from the global buffer 160 to the normal latch unit NLAT and transfer the data from the sensing latch units SLAT1 and SLAT2 to the control logic 150 under control of the control logic 150.

Figure 7:
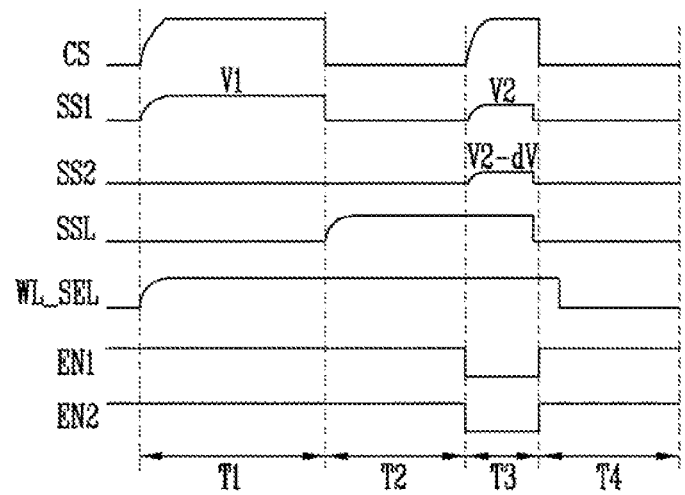
FIG. 7 is a timing diagram illustrating a verification operation according to an embodiment of the present invention.

FIG. 7 is a timing diagram illustrating a verification operation according to an embodiment of the present invention.

Figure 8:
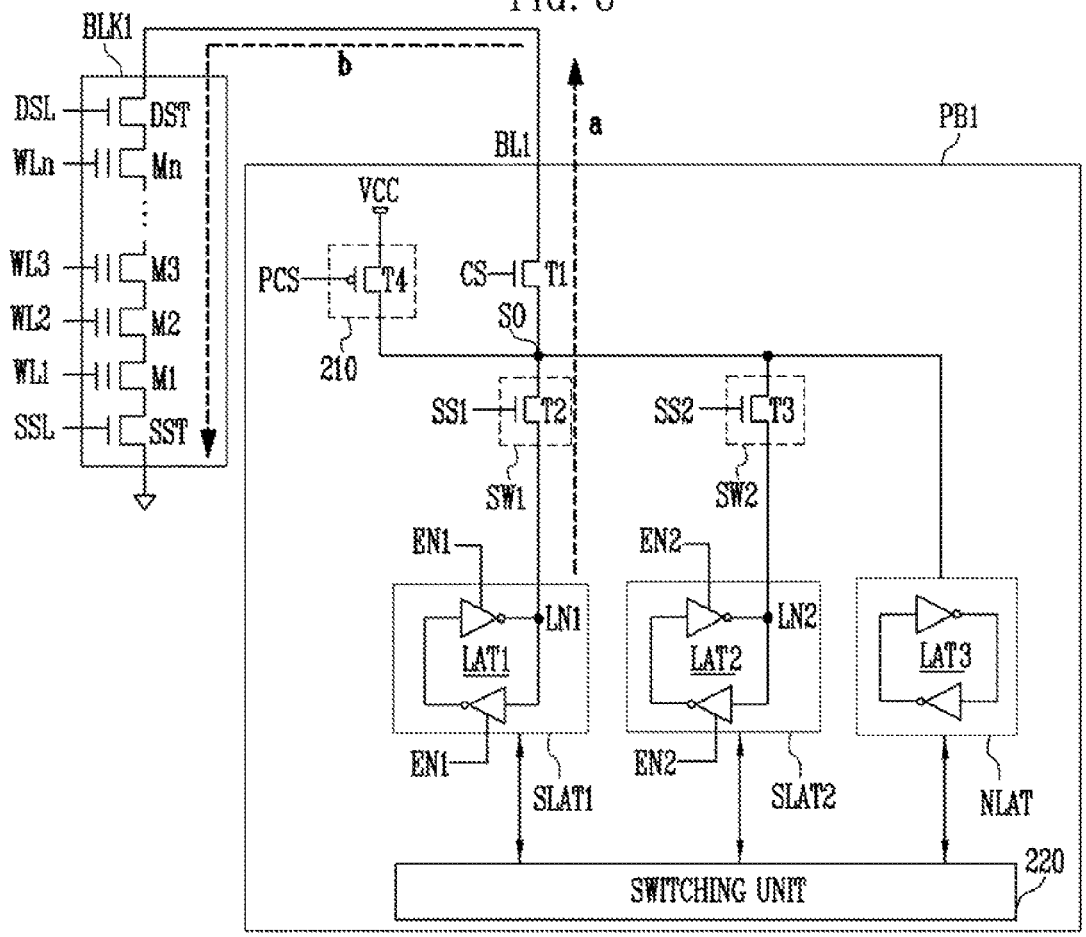
FIGS. 8 and 9 are circuit diagrams illustrating a verification operation shown in FIG. 7 in detail.
Figure 9:
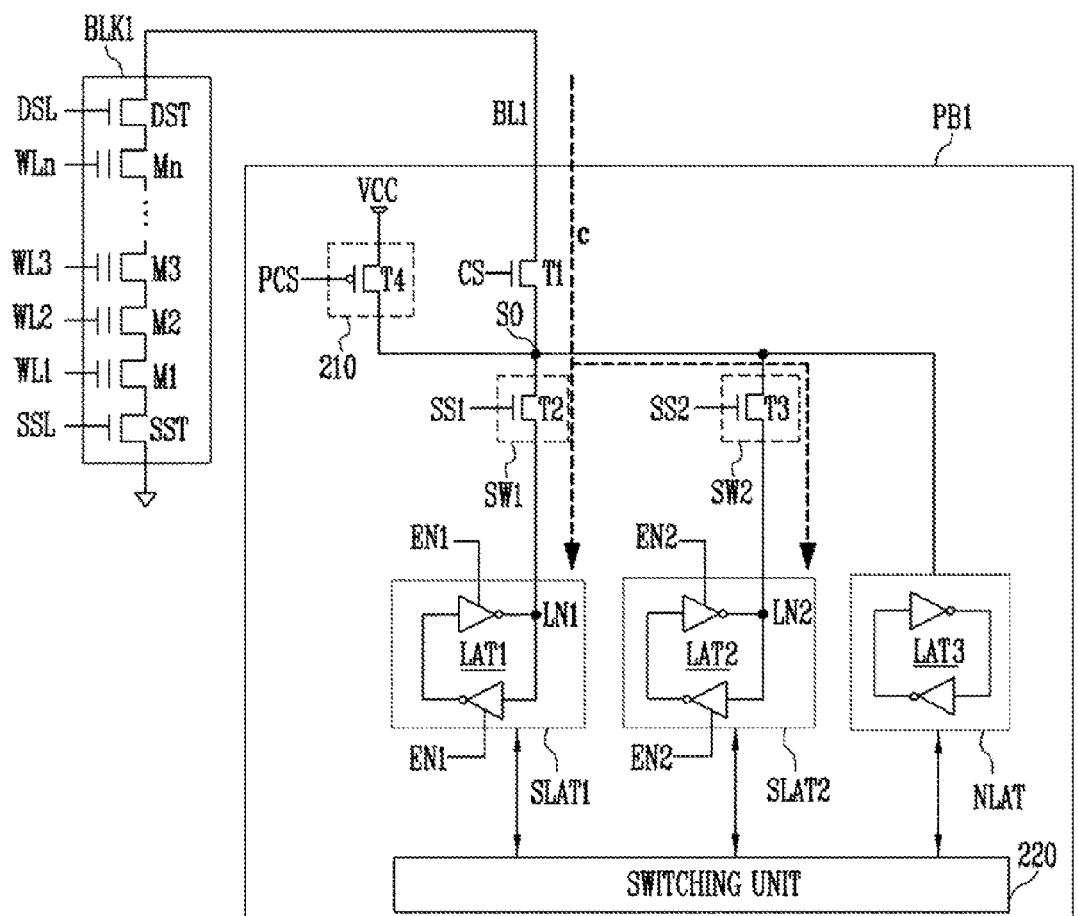

FIGS. 8 and 9 are circuit diagrams illustrating a verification operation shown in FIG. 7 in detail.

Referring to FIGS. 7 to 9, the bit line BL1 may be precharged during a first time period T1. The connection signal CS may increase to a voltage greater than a first voltage V1 and the first sensing signal SS1 may increase to the first voltage V1. Each of the first and the second enable signals EN1 and EN2 may have an enable state of a logic value "high." Since the first latch node NL1 has a logic value "high" at initial state, charges of the first latch node NL1 may be transferred to the bit line BL1 through the sensing node SO. In other words, the voltage of the sensing node SO may increase to a voltage obtained by subtracting Vth or the threshold voltages of T2 and T3 from the first voltage V1, and the voltage of the sensing node SO may be transferred to the bit line BL1 through the first transistor T1 by the connection signal CS having a high voltage. Since each of the first and the second enable signals EN1 and EN2 has the enable state, each of the first and the second latch nodes LN1 and LN2 may maintain the logic value "high."

The bit line BL1 may receive charges from the first latch node NL1 through the sensing node SO and be precharged ("a" shown in FIG. 8).

According to an embodiment, the bit line BL1 may receive charges from the second latch node LN2 through the sensing node SO. According to the embodiment, the second sensing signal SS2 may increase to the first voltage V1 during the first time period T1. According to an embodiment, the bit line BL1 may receive charges from the first and the second latch nodes LN1 and LN2 through the sensing node SO. The first and the second sensing signals SS1 and SS2 may increase to the first voltage V1 during the first time period T1.

Evaluation may be performed during a second time period T2. The connection signal CS and the first sensing signal SS1 may have a ground voltage. The source selection transistor SST may be turned on by applying, for example, the power voltage to the source selection line SSL. For example, the target voltage TV shown in FIG. 4 may be applied to a selected word line WL_SEL. A turn-on voltage of the selected memory cell may depend on the difference between a threshold voltage of the selected memory cell coupled to the selected word line WL_SEL, for example, WL1 and the target voltage TV. The charges precharged to the bit line BL1 may be discharged through the source selection transistor SST depending on turn-on of the selected memory cell ("b" shown in FIG. 8). Though not illustrated in FIG. 7, a verification pass voltage may be applied to unselected word lines, for example, WL2 to WLn and the power voltage may be applied to the drain selection line so that memory cells coupled to the unselected word lines may be turned on.

The connection signal CS may increase to a voltage greater than the first voltage V1 during a third time period T3. The voltage of the bit line BL1 may be transferred to the sensing node SO. The voltage of the source selection line SSL may be maintained at the power voltage, and the voltage of the selected word line WL_SEL may be maintained at the target voltage as shown in FIG. 7 for illustrative purposes. In an example, a ground voltage may be applied to the source selection line SSL and the selected word line WL_SEL.

The first sensing signal SS1 may increase to a second voltage V2. The second sensing signal SS2 may increase to a third voltage (V2-dV), which is obtained by subtracting a predetermined voltage from the second voltage V2. In other words, the voltage of the first sensing signal SS1 may be greater than the voltage of the second sensing signal SS2.

The first and the second enable signals EN1 and EN2 may be disabled to a logic value "low." The first and the second sensing latch units SLAT1 and SLAT2 may store changed data, depending on electrical connection of the first and the second sensing units SLAT1 and SLT2 to the sensing node SO.

According to an embodiment of the present invention, the second and third transistors T2 and T3 may simultaneously sense the voltage of the sensing node SO and transfer data to the first and the second sensing latch units SLAT1 and SLAT2, respectively.

This will be described in detail below.

Both the second and third transistors T2 and T3 may be turned on by the voltage of the sensing node SO that is lower than a voltage obtained by subtracting Vth from the third voltage (V2-dV). The logic value of each of the first and the second latch nodes LN1 and LN2 may be changed to "low." In other words, the selected memory cell may be much lower than the target voltage TV. For example, the selected memory cell may be determined to have a threshold voltage that is lower than the critical voltage CV.

In this example, a program enablement voltage may be applied to the bit line BL1 during a subsequent program operation.

The second transistor T2 may be turned on and the third transistor T3 may be turned off by the voltage of the sensing node SO that is lower than the voltage, which is obtained by subtracting Vth from the second voltage V2, and is higher than the voltage, obtained by subtracting Vth from the third voltage (V2-dV). The logic value of the first latch node NL1 may be changed to "low," and the logic value of the second latch node LN2 may maintain "high." For example, the selected memory cell may be determined to have a threshold voltage higher than the critical voltage CV shown in FIG. 4 and lower than the target voltage TV shown in FIG. 4.

In this example, a voltage between the program enablement voltage and the program inhibition voltage may be applied to the bit line BL1 during a subsequent program operation.

Both second and third transistors T2 and T3 may be turned off and the first and the second latch nodes LN1 and LN2 may maintain the logic values "high" when the voltage of the sensing node SO that is greater than the voltage obtained by subtracting Vth from the second voltage V2. For example, the selected memory cell may be determined to have the program state P shown in FIG. 4.

In other words, the selected memory cell may have a threshold voltage greater than the target voltage TV. The program inhibition voltage may be applied to the bit line BL1 during a subsequent program operation.

As a result, the voltage of the bit line BL1 may be transferred to the sensing node SO, and the first and the second switching devices SW1 and SW2 may simultaneously sense the voltage of the sensing node SO and transfer data to the sensing latch units SLAT1 and SLAT2 ("c" shown in FIG. 9), which lead to the same effect as two verification operations through the critical voltage CV and the target voltage TV.

The first and the second enable signals EN1 and EN2 may be enabled to a logic value "high" during a fourth time period T4. Thus, the first and the second sensing latch units SLAT1 and SLAT2 may latch the transferred data.

The connection signal CS and the first and the second sensing signals SS1 and SS2 may be changed to a ground voltage. The sensing node SO may be discharged.

According to an embodiment of the present invention, the page buffer PB1 may include the switching devices SW1 and SW2 that are coupled between the sensing node SO and the first and the second sensing latch units SLAT1 and SLAT2. In addition, during a verification operation, the first and the second sensing signals SS1 and SS2 may be supplied in order to control the switching devices SW1 and SW2, respectively, when a threshold voltage of a memory cell is reflected on the sensing node SO through the bit line BL1. Two sensing operations may be performed at the same time after a single evaluation, which leads to the same effect as performing two verification operations. As a result, a program speed of the semiconductor memory device 100 may be improved.

Figure 10:
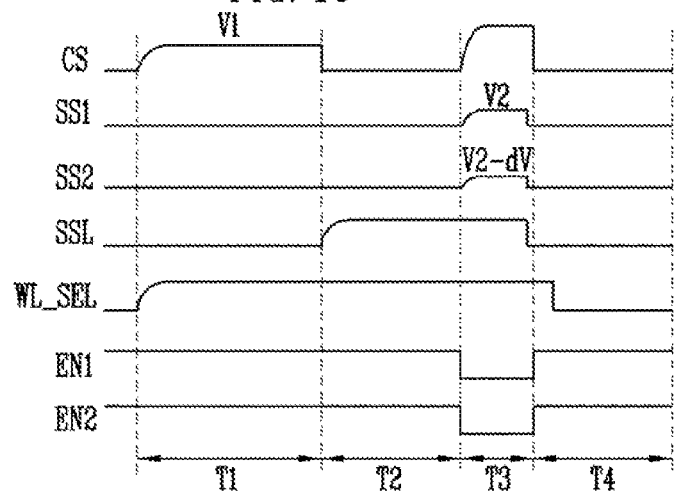
FIG. 10 is a timing diagram illustrating a verification operation according to an embodiment of the present invention.

FIG. 10 is a timing diagram illustrating a verification operation according to an embodiment of the present invention.

Figure 11:
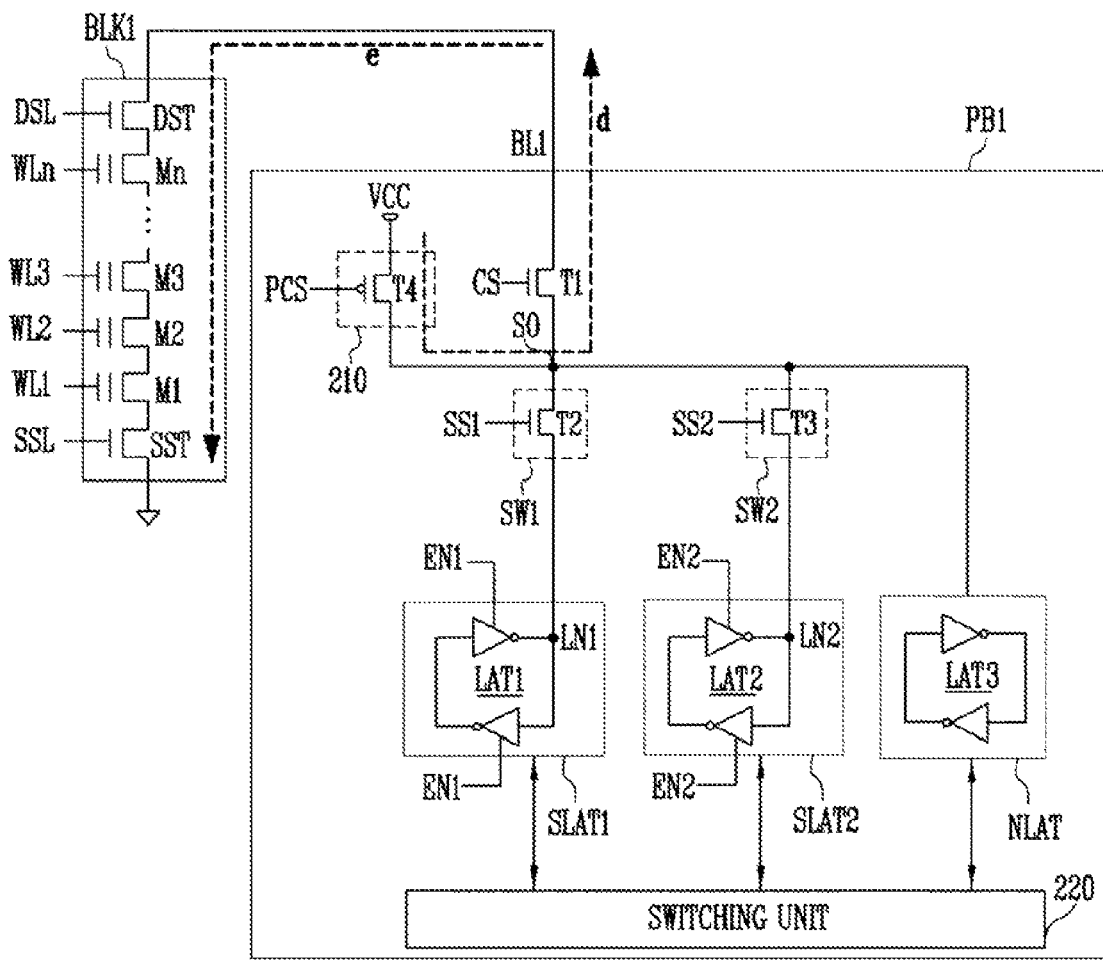
FIGS. 11 and 12 are circuit diagrams illustrating a verification operation shown in FIG. 10 in detail.
Figure 12:
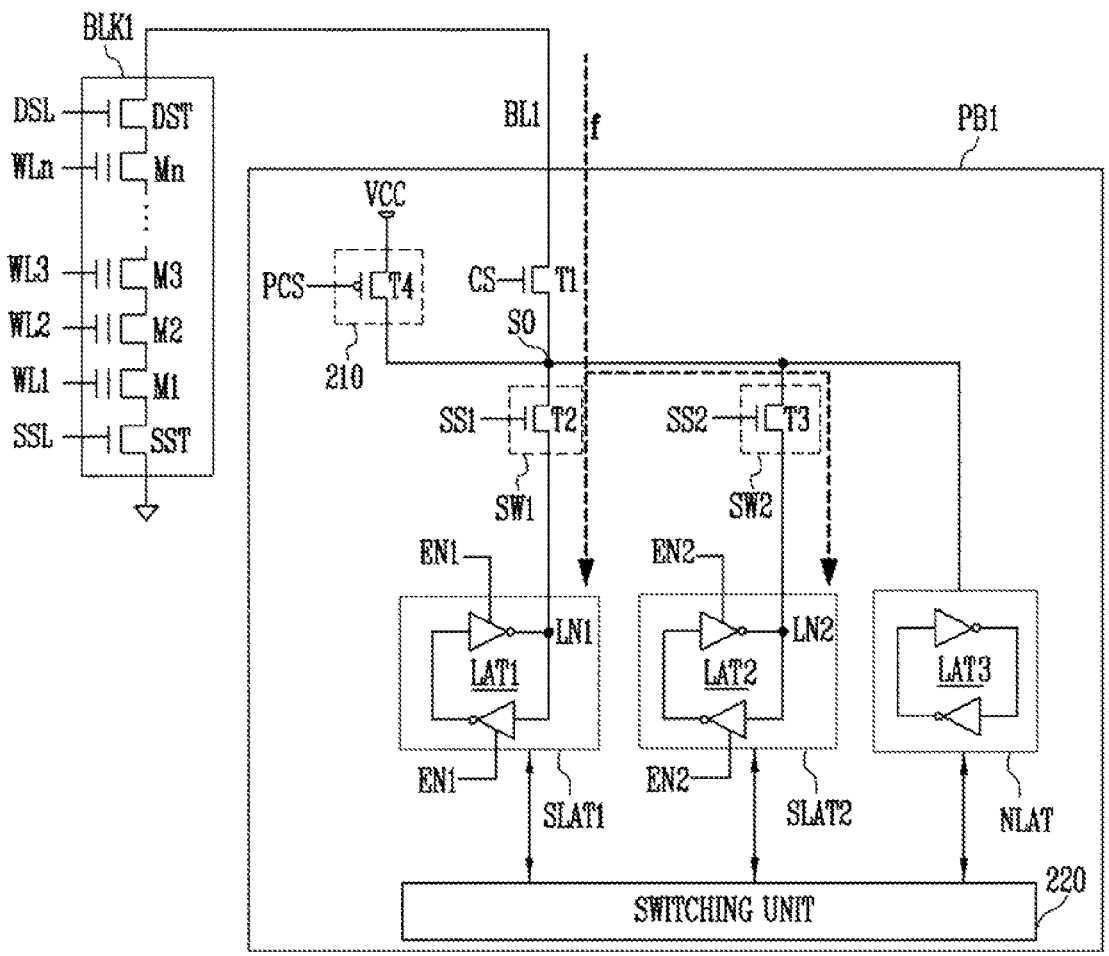

FIGS. 11 and 12 are circuit diagrams illustrating a verification operation shown in FIG. 10 in detail.

Referring to FIG. 10, all signals may be controlled in substantially the same manner as shown in FIG. 7 except for the connection signal CS and the first sensing signal SS1. Thus, a detailed description thereof will be omitted.

The connection signal CS may have the first voltage V1 during the first time period T1. Though not illustrated in FIG. 10, the precharge signal PCS may be enabled with a logic value "low." The first sensing signal SS1 may be maintained at a ground voltage during the first time period T1.

Therefore, as illustrated in FIG. 11, the bit line BL1 may be precharged from the power node VCC through the precharge unit 210 and the sensing node SO ("d" shown in FIG. 11). The bit line BL1 may increase from the first voltage V1 to a voltage, which is obtained by subtracting a threshold voltage of the first transistor T1 from the first voltage V1, in response to the connection signal CS having the first voltage V1.

Subsequently, evaluation may be performed so that the charges precharged to the bit line BL1 may be discharged through the source selection transistor SST depending on turn-on of the selected memory cell ("e" shown in FIG. 11). In addition, the voltage of the bit line BL1 may be transferred to the sensing node SO and the first and the second switching devices SW1 and SW2 may simultaneously sense the voltage of the sensing node SO and may transfer corresponding data to the first and the second sensing latch units SLAT1 and SLAT2 ("f" shown in FIG. 12).

Figure 13:
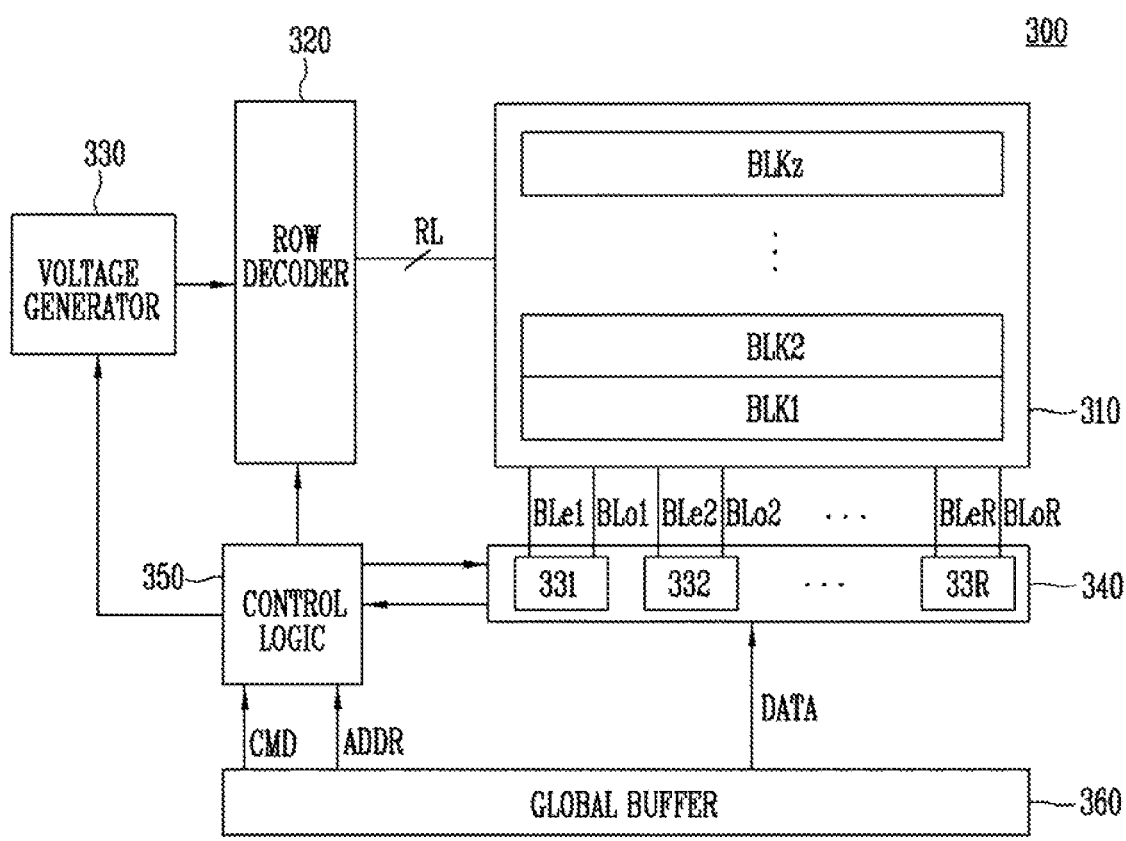
FIG. 13 is a block diagram illustrating a semiconductor memory device according to an embodiment of the present invention.

FIG. 13 is a block diagram illustrating a semiconductor memory device according to an embodiment of the present invention.

Referring to FIG. 13, the semiconductor memory device 300 may include a memory cell array 310, a row decoder 320, a voltage generator 330, a read and write circuit 340, a control logic 350 and a global buffer 360.

A plurality of page buffers 331 to 33R included in the read and write circuit 340 may be coupled to the memory cell array 310 through even bit lines BLe1 to BLeR and odd bit lines BLo1 to BLoR. Each of the page buffers 331 to 33R may be coupled to the memory cell array 310 through a pair of a single even bit line and a single odd bit line.

Figure 14:
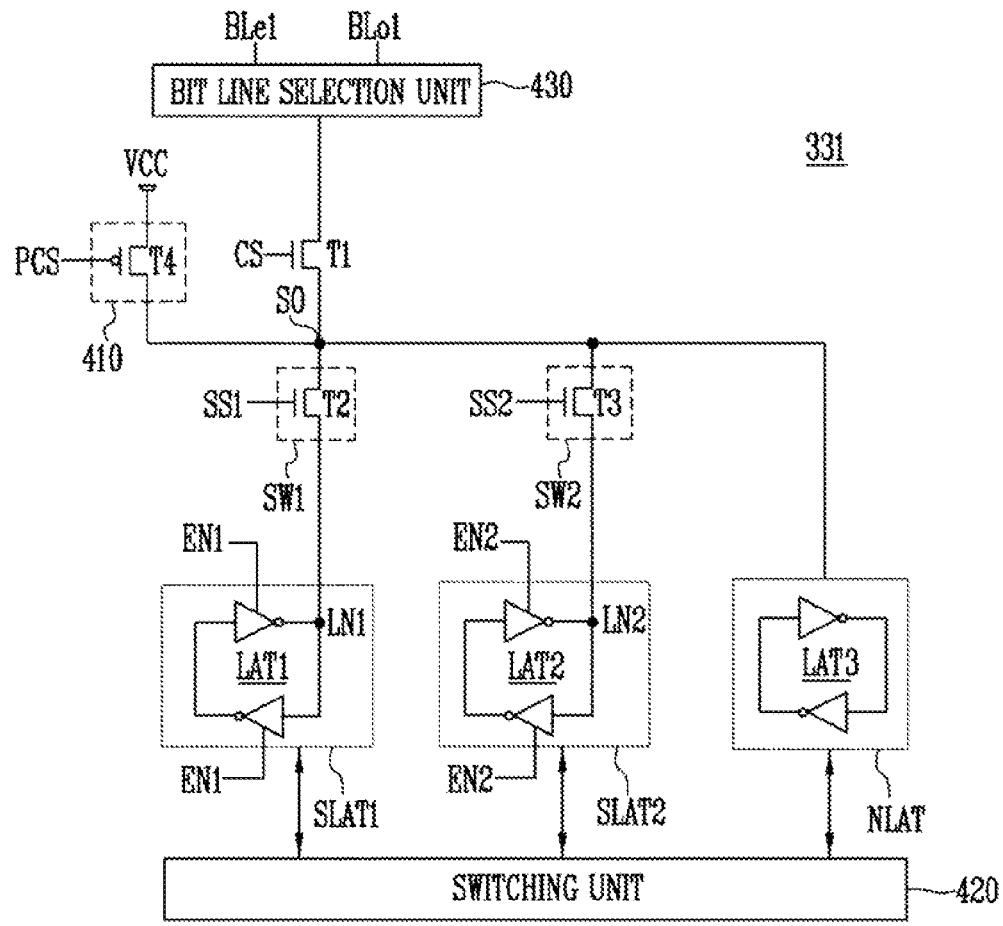
FIG. 14 is a block diagram illustrating a page buffer shown in FIG. 13.

FIG. 14 is a block diagram illustrating a page buffer shown in FIG. 13. FIG. 14 illustrates the page buffer 331 as an example.

Referring to FIG. 14, the page buffer 331 may include a transistor T1, a first and a second switching devices SW1 and SW2, a first and a second sensing latch units SLAT1 and SLAT2, at least one normal latch unit NLAT, a precharge unit 410, a switching unit 420, and a bit line selection unit 430.

The present invention may also cover even-odd bit line structure. In other words, the page buffer 331 may include the bit line selection unit 430 that is coupled to the even bit line BLe1 and the odd bit line BLo1. During a verification operation, the bit line selection unit 430 may select between the even bit line BLe1 and the odd bit line BLo1 and electrically connect a selected bit line to the transistor T1. In addition, the verification operation may be performed according to the embodiment described with reference to FIGS. 7 to 9 and the embodiment described with reference to FIGS. 10 to 12.

Figure 15:
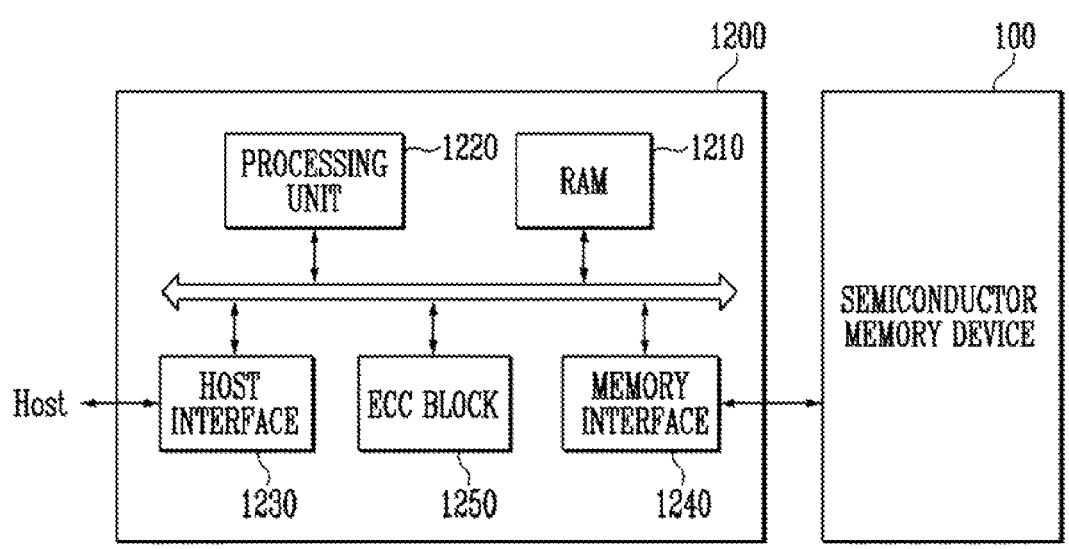
FIG. 15 is a block diagram illustrating a memory system including the semiconductor memory device shown in FIG. 1.

FIG. 15 is a block diagram illustrating a memory system including the semiconductor memory device shown in FIG. 1.

Referring to FIG. 15, the memory system 1000 may include the semiconductor memory device 100 and a controller 1200.

The semiconductor memory device 100 may be configured and operated in the same manner as described above with reference to FIG. 1 or 13. Thus, a detailed description thereof will be omitted.

The controller 1200 may be coupled to a host and the semiconductor memory device 100. The controller 1200 may access the semiconductor memory device 100 in response to a request from the host. For example, the memory controller 1200 may control read, write, erase and background operations of the semiconductor memory device 100. The controller 1200 may provide an interface between the semiconductor memory device 100 and the host. The controller 1200 may drive firmware for controlling the semiconductor memory device 100.

The controller 1200 may include random access memory (RAM) 1210, a processing unit 1220, a host interface 1230, a memory interface 1240 and an error correcting code (ECC) block 1250. The RAM 1210 may function as at least one of an operation memory of the processing unit 1220, a cache memory between the memory device 200 and the host, and a buffer memory between the semiconductor memory device 100 and the host. The processing unit 1220 may control the general operation of the controller 1200.

The host interface 1230 may include a protocol for data exchange between the host and the controller 1200. According to an exemplary embodiment, the controller 1200 may be configured to communicate with the host through one of various interface protocols including a Universal Serial Bus (USB) protocol, a multimedia card (MMC) protocol, a peripheral component interconnection (PCI) protocol, a PCI-express (PCI-E) protocol, an Advanced Technology Attachment (ATA) protocol, a Serial-ATA protocol, a Parallel-ATA protocol, a small computer small interface (SCSI) protocol, an enhanced small disk interface (ESDI) protocol, an Integrated Drive Electronics (IDE) protocol and a private protocol.

The memory interface 1240 may include a protocol for communication with the semiconductor memory device 100. For example, the memory interface 1240 may include at least one of flash interfaces, such as a NAND interface and a NOR interface.

The ECC block 1250 may detect an error in data from the semiconductor memory device 100 by using an error correcting code (ECC).

The controller 1200 and the semiconductor memory device 100 may be integrated into a single semiconductor device. In an exemplary embodiment, the controller 1200 and the semiconductor memory device 100 may be integrated into a single semiconductor device to form a memory card. For example, the controller 1200 and the semiconductor memory device 100 may be integrated into a single semiconductor device to form a PC card (personal computer memory card international association (PCMCIA)), a compact flash (CF) card, a smart media card (SM or SMC), a memory stick, a multimedia card (MMC, RS-MMC or MMCmicro), an SD card (SD, miniSD, microSD or SDHC), or universal flash storage (UFS).

The controller 1200 and the semiconductor memory device 100 may be integrated into a single semiconductor device to form a semiconductor drive (Solid State Drive (SSD)). The semiconductor drive (SSD) may include a storage device configured to store data in a semiconductor memory. When the memory system 1000 is used as the semiconductor drive (SSD), an operating speed of the host coupled to the memory system 1000 may be significantly improved.

In another example, the memory system 1000 may be used as one of various components of an electronic device, such as a computer, an ultra mobile PC (UMPC), a workstation, a net-book, personal digital assistants (PDAs), a portable computer, a web tablet, a wireless phone, a mobile phone, a smart phone, an e-book, a portable multimedia player (PMP), a portable game machine, a navigation device, a black box, a digital camera, a three-dimensional (3D) television, a digital audio recorder, a digital audio player, a digital picture recorder, a digital picture player, a digital video recorder, a digital video player, a device for transmitting/receiving information in wireless environment, one of various electronic devices for home network, one of various electronic devices for computer network, one of various electronic devices for telematics network, an RFID device and/or one of various devices for computing systems, etc.

In an exemplary embodiment, the semiconductor memory device 2100 or the memory system 1000 may be packaged in a variety of ways. For example, in some embodiments, the semiconductor memory device 100 or the memory system 1000 may be packaged using various methods such as a package on package (PoP), ball grid arrays (BGAs), chip scale packages (CSPs), a plastic leaded chip carrier (PLCC), a plastic dual in line package (PDIP), a die in waffle pack, a die in wafer form, a chip on board (COB), a ceramic dual in line package (CERDIP), a plastic metric quad flat pack (MQFP), a thin quad flatpack (TQFP), a small outline (SOIC), a shrink small outline package (SSOP), a thin small outline (TSOP), a thin quad flatpack (TQFP), a system in package (SIP), a multi chip package (MCP), a wafer-level fabricated package (WFP) and/or a wafer-level processed stack package (WSP), etc.

Figure 16:
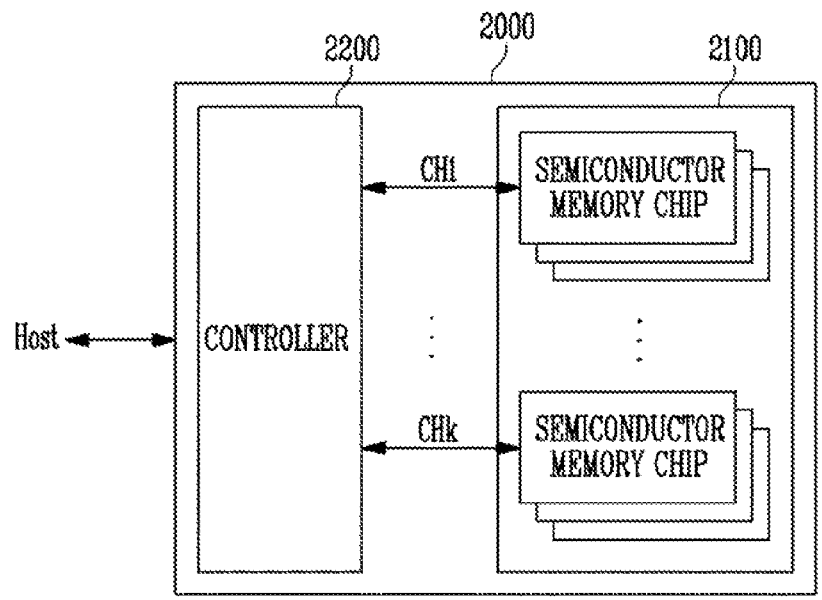
FIG. 16 is a block diagram illustrating an example of an application of the memory system shown in FIG. 15.

FIG. 16 is a block diagram illustrating an example of an application of the memory system shown in FIG. 15.

Referring to FIG. 16, a memory system 2000 may include the semiconductor memory device 2100 and the controller 2200. The semiconductor memory device 2100 may include a plurality of semiconductor memory chips. The semiconductor memory chips may be divided into a plurality of groups.

FIG. 16 illustrates the plurality of groups communicating with the controller 220 through the first to k-th channels CH1 to CHk, respectively. Each of the memory chips may be configured and operated in substantially the same manner as the semiconductor memory device 100 described above with reference 1.

Each of the groups may communicate with the controller 2200 through a single common channel. The controller 2200 may be configured in substantially the same manner as the controller 1200 as described above with reference to FIG. 15 and may control the plurality of memory chips of the semiconductor memory device 2100.

FIG. 16 illustrates the plurality of semiconductor memory chips coupled to a single channel. However, the memory system 2000 may be modified so that a single semiconductor memory chip may be coupled to a single channel.

Figure 17:
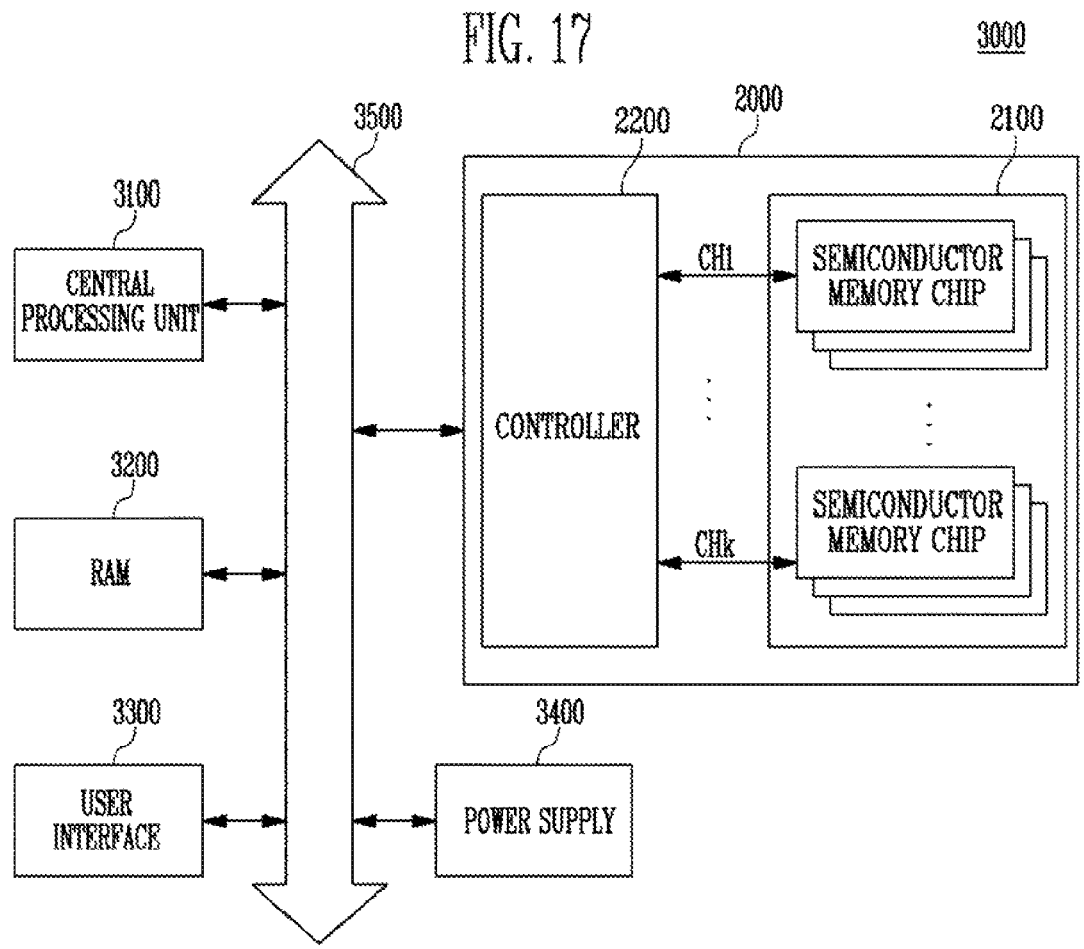
FIG. 17 is a block diagram illustrating a computing system including the memory system shown in FIG. 16.

FIG. 17 is a block diagram illustrating a computing system including the memory system shown in FIG. 16.

Referring to FIG. 17, the computing system 3000 may include a central processing unit 3100, random access memory (RAM) 3200, a user interface 3300, a power supply 3400, a system bus 3500 and the memory system 2000.

The memory system 2000 may be electrically coupled to the central processing unit 3100, the RAM 3200, the user interface 3300 and the power supply 3400 through the system bus 3500. Data provided through the user interface 3300 or processed by the central processing unit 3100 may be stored in the memory system 2000.

FIG. 17 illustrates the semiconductor memory device 2100 coupled to the system bus 3500 through the controller 2200. However, the semiconductor memory device 2100 may be directly coupled to the system bus 3500. Functions of the controller 2200 may be performed by the central processing unit 3100 and the RAM 3200.

FIG. 17 illustrates the memory system 2000 described above with reference to FIG. 16. However, the memory system 2000 may be replaced by the memory system 1000 described above with reference to FIG. 15. In an exemplary embodiment, the computing system 3000 may include the memory systems 1000 and 2000 described above with reference to FIGS. 15 and 16, respectively.

According to an embodiment of the present invention, a semiconductor memory device having improved speed, a method of operating the same, a memory system having the same and a computing system having the same are provided.

What is claimed is:

1. A semiconductor memory device, comprising:
   a memory cell;
   a page buffer including a first and a second switching devices coupled in common to a sensing node coupled to the memory cell through a bit line and a first and a second sensing latch units coupled to the sensing node, respectively, through the first and second switching devices; and
   a control logic suitable for transferring a first and a second sensing signals, respectively, to the first and second switching devices when a threshold voltage of the memory cell is reflected on the sensing node through the bit line during a verification operation, the first and second sensing signals having different voltage levels, wherein each of the first and second switching devices is turned on or off according to a voltage of the sensing node and a voltage of a corresponding sensing signal such that the voltage of the sensing node is transferred to the first and second sensing latch units through the first and second switching devices as data bits.

2. The semiconductor memory device of claim 1, wherein a first and a second bits are sensed by the first and second sensing latch units in response to the first and second sensing signals, respectively.

3. The semiconductor memory device of claim 2, wherein one of a program enablement voltage, a program inhibition voltage and a voltage between the program enablement voltage and the program inhibition voltage is applied to the bit line in response to the first and second bits during a program operation subsequent to the verification operation.

4. The semiconductor memory device of claim 3, wherein the program enablement voltage is applied to the bit line when each of the first and second bits has a first logic value,
   the voltage between the program enablement voltage and the program inhibition voltage is applied to the bit line when the first bit has the first logic value and the second bit has a second logic value, and
   the program Inhibition voltage is applied to the bit line when each of the first and second bits has the second logic value.

5. The semiconductor memory device of claim 1, wherein the bit line is precharged with charges transferred from at least one of the first and second sensing latch units through the sensing node during the verification operation.

6. The semiconductor memory device of claim 1, wherein the page buffer further includes a precharge unit coupled between a power node and the sensing node, and
   the bit line is precharged with charges transferred from the precharge unit through the sensing node during the verification operation.

7. The semiconductor memory device of claim 1, wherein the control logic is suitable for further transferring a first and a second enable signals to the first and second sensing latch units, respectively.

8. The semiconductor memory device of claim 7, wherein the voltage of the sensing node is transferred to the first and second sensing latch units through the first and second switching devices as the data bits when the first and second enable signals are disabled.

9. The semiconductor memory device of claim 8, wherein the data bits are maintained in the first and second sensing latch units when the first and second enable signals are enabled.

10. The semiconductor memory device of claim 1, wherein the first switching device transfers the voltage of the sensing node to the first sensing latch unit as a first data bit in response to a voltage of the first sensing signal, and the second switching device transfers the voltage of the sensing node to the second sensing latch unit as a second data bit in response to the second sensing signal.

11. A method of operating a semiconductor memory device, the method comprising:
   precharging a bit line coupled to a memory cell;
   discharging charges precharged to the bit line depending on a threshold voltage of the memory cell; and
   transferring a plurality of sensing signals to a plurality of switching devices coupled between a sensing node and sensing latch units when a voltage of the bit line is transferred to the sensing node, the plurality of sensing signals having different voltage levels, wherein each of the plurality of switching devices is turned on or off according to a voltage of the sensing node and a voltage of a corresponding sensing signal such that the voltage of the sensing node is transferred to the sensing latch units through the plurality of switching devices as a plurality of data bits.

12. The method of claim 11, wherein the precharging of the bit line includes supplying the charges to the bit line from one or more of the sensing latch units through the sensing node.

13. The method of claim 11, wherein the precharging of the bit line comprises supplying the charges to the bit line through the sensing node by a precharge unit coupled to the sensing node.

14. The method of claim 11, further comprising transferring a plurality of enable signals to the sensing latch units, wherein the sensing latch units are deactivated in response to the plurality of enable signals.

15. The method of claim 14, wherein the voltage of the sensing node is transferred to the sensing latch units through the plurality of switching devices as the plurality of data bits when the plurality of enable signals are disabled.

16. The method of claim 15, wherein the plurality of data bits are maintained in the sensing latch units when the plurality of enable signals are enabled.

17. The method of claim 11, further comprising applying one of a program enablement voltage, a program inhibition voltage and a voltage between the program enablement voltage and the program inhibition voltage to the bit line in response to the plurality of data bits transferred to the sensing latch units during a program operation.

18. A memory system, comprising:
a semiconductor memory device; and
a controller suitable for controlling the semiconductor memory device,
wherein the semiconductor memory device comprises:
a memory cell;
a page buffer including a first and a second switching devices coupled in common to a sensing node coupled to the memory cell through a bit line and a first and a second sensing latch units coupled to the sensing node, respectively, through the first and second switching devices; and
a control logic suitable for transferring a first and a second sensing signals, respectively, to the first and second switching devices when a threshold voltage of the memory cell is reflected on the sensing node through the bit line during a verification operation, the first and second sensing signals having different voltage levels,
wherein each of the first and second switching devices is turned on or off according to a voltage of the sensing node and a voltage of a corresponding sensing signal such that the voltage of the sensing node is transferred to the first and second sensing latch units through the first and second switching devices as data bits.

19. A computing system, comprising:
a semiconductor memory device,
wherein the semiconductor memory device comprises:
a memory cell;
a page buffer including a first and a second switching devices coupled in common to a sensing node coupled to the memory cell through a bit line and a first and a second sensing latch units coupled to the sensing node, respectively, through the first and second switching devices; and
a control logic suitable for transferring a first and a second sensing signals respectively to the first and second switching devices when a threshold voltage of the memory cell is reflected on the sensing node through the bit line during a verification operation, the first and second sensing signals having different voltage levels,
wherein each of the first and second switching devices is turned on or off according to a voltage of the sensing node and a voltage of a corresponding sensing signal such that the voltage of the sensing node is transferred to the first and second sensing latch units through the first and second switching devices as data bits.

20. The semiconductor memory device of claim 1, wherein the first and second sensing signals are transferred simultaneously to the first and second switching devices.

* * * * *